Aug. 30, 1955 W. SHOCKLEY 2,716,729
TRANSISTOR CIRCUITS WITH CONSTANT OUTPUT CURRENT
Filed Nov. 24, 1951
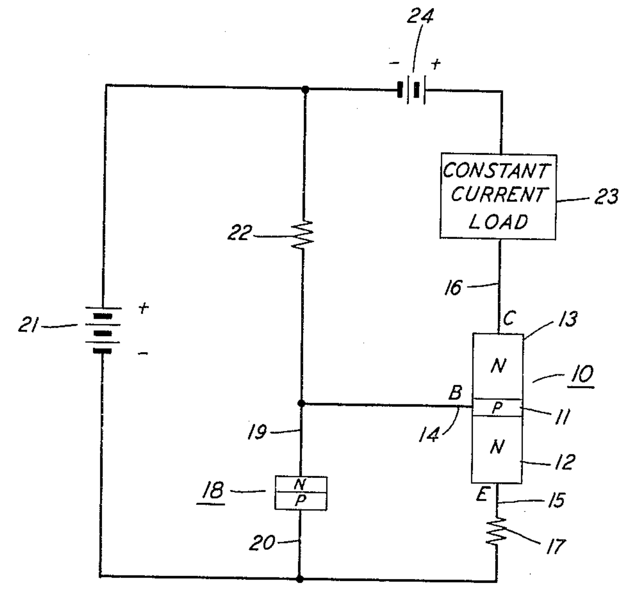
INVENTOR
W. SHOCKLEY
BY [signature]
ATTORNEY 2,716,729
Patented Aug. 30, 1955

2,716,729

TRANSISTOR CIRCUITS WITH CONSTANT OUTPUT CURRENT

William Shockley, Madison, N. J., assignor to Bell Telephone Laboratories, Incorporated, New York, N. Y., a corporation of New York Application November 24, 1951, Serial No. 258,071

4 Claims. (Cl. 323—7)

This invention relates to electrical circuits and more particularly to circuits including semiconductor amplifiers of the class known as transistors.

In a number of electrical control and supply circuits and systems, it is highly desirable, or even necessary for satisfactory performance, that the current supplied to an operating element or load be substantially constant, unaffected by voltage or current variations in the circuit or system and essentially independent of the impedance of the element or load. One general object of this invention is to provide a relatively simple and efficient circuit capable of producing and maintaining at a pair of terminals thereof a constant current, which current may be controlled facilely to be of any desired amplitude within a wide range of values.

The invention is applicable particularly to circuits including semiconductor amplifiers of the type known as junction transistors, such as are disclosed in Patent 2,569,347 granted September 25, 1951 to W. Shockley and in the article of W. J. Pietenpol and R. L. Wallace in the Bell System Technical Journal, July 1951, page 530. However, it may be utilized also in circuits including other transistors, for example of the point control type such as are disclosed in Patent 2,524,035, granted October 3, 1950 to J. Bardeen and W. H. Brattain. Transistors of the types noted comprise, basically, a body of semiconductive material, for example germanium or silicon, and three connections to this body which are designated as the base, emitter and collector. A particularly significant performance parameter thereof is the current amplification factor, designated $\alpha$. For junction type transistors, as noted in the article above-identified, this factor is slightly less than unity, say 0.985 or higher. Like values of $\alpha$, that is substantially unity, are obtainable also for point contact type transistors. The parameters and the relationships involved in the performance of typical transistors are disclosed in detail in the article mentioned. Note may be made particularly of the non-linearity of the emitter voltage-emitter current-characteristic and the good saturation of the collector voltage-collector current characteristic when the collector is biased in the current saturation range.

The invention in one broad aspect involves, and a feature thereof resides in, a combination of a transistor and a semiconductor diode cooperatively associated so that the collector current of the transistor is substantially constant and of magnitude readily amenable to control by operation upon a single circuit parameter, specifically, in one embodiment, the magnitude of a resistor in the emitter circuit of the transistor.

In one specific embodiment of this invention, a junction type semiconductor diode is connected between the base and emitter of a transistor, in series with a resistor very large in comparison to the nominal base-emitter impedance. The transistor is one having a current multiplication factor of substantially unity. A load is connected between the base and collector of the transistor, the collector being biased so that it operates at or above its saturation point. The diode is biased in the reverse direction and in the Zener current range, as in the manner disclosed in detail in the application Serial No. 211,212 filed February 16, 1951 of W. Shockley and in the article by W. Shockley et al. in Physical Review, volume 93, August 1, 1951, page 650. As is there described, the Zener or breakdown current range is that range of currents resulting when the diode is biased at or beyond the critical Zener or breakdown voltage where small changes in applied voltage produce large changes in current. Conversely, in this breakdown current range the voltage across the diode will be substantially independent of the current therethrough. Thus, a constant voltage is established between the base and a reference point associated with the emitter. As the Zener voltage is large relative to the emitter to base voltage, the emitter current is essentially equal to the quotient of the Zener voltage and the resistance, aforenoted, in series with the emitter, and is fixed. Because the current amplification factor of the transistor is substantially unity, the collector current is equal in amplitude to the emitter current and fixed. Hence, a constant current is applied to the load. Its absolute magnitude may be made of a desired value by appropriate selection or adjustment of the series resistor mentioned.

The invention and the several features thereof will be understood more clearly and fully from the following detailed description with reference to the accompanying drawing in which the single figure is a circuit diagram depicting one illustrative embodiment of this invention.

In the drawing, 10 is a semiconductive amplifier or transistor which may be of the junction type disclosed in the patent to W. Shockley referred to hereinabove. It comprises a body of semiconductive material, such as germanium or silicon, having therein a thin zone 11 of P conductivity type between and contiguous with a pair of zones 12 and 13 of N conductivity type, and substantially ohmic base, emitter and collector connections 14, 15 and 16 respectively, to the several zones as shown.

Connected between the base and emitter 14 and 15 respectively, and in series relation, are a resistor 17 and a junction diode 18. The latter comprises a body of semiconductive material, such as germanium or silicon, having a pair of contiguous zones of opposite conductivity types, i. e. N and P types as indicated in the drawing, and substantially ohmic connections 19 and 20 to these zones. The diode 18 is biased in the reverse direction by a direct-current source 21 through a series resistor 22.

A load 23 is connected between the collector and base of the transistor 10, the circuit including the resistor 22 and, if desired for reasons which will appear presently, an auxiliary direct-current source 24.

In use of the circuit described, the diode 18 is biased by the source 21 in the Zener range whereby the voltage across its terminals 19 and 20 is substantially constant, unaffected by current variations. Thus, the potential of the base connection 14 is fixed. The bias upon the collector of the transistor 10 is made such that the collector operates substantially above its saturation point and in the saturation range. This may be effected conveniently and advantageously by adjustment of the voltage supplied by source 24 whereby the load voltage may be controlled separately from the source 21, although it will be understood that the source 24 may be omitted and both the diode 18 and collector biases controlled from the source 21. Under these conditions the collector current is independent of collector voltage so that the constant current established by the diode 18 and resistor 17 is unaffected by collector voltage.

The transistor is of the type having a current multiplication factor of substantially unity so that the collector, and load, current is substantially equal in amplitude, although opposite in sign, to the emitter current. The Zener voltage across the diode 18 is large, say of the order of ten times as great as, in comparison to the base to emitter drop in the body of the transistor 10, it being noted that the junction between the zones 11 and 12 is biased in the forward direction. Hence, the emitter current, and consequently the collector current, is substantially equal to the quotient of the Zener voltage divided by the resistor 17. Thus, a substantially constant current is supplied to the load 23. This current may be fixed at a desired value by use of a resistor 17 of appropriate magnitude.

In a typical and illustrative circuit including a germanium transistor, the diode bias may be 5 volts, the collector of transistor 10 may be biased at as low as 0.2 volt up to 40 volts relative to the base, and the resistor 17 may be 5,000 ohms. For these conditions, a fixed current of 1 milliampere is supplied to the load 23.

Although in the embodiment of the invention shown and described the transistor 10 is of the junction type, it will be appreciated that point contact transistors having a current multiplication factor of substantially unity also may be employed. Further, although in the specific embodiment of the invention described the transistor 10 is of NPN configuration, it will be understood that junction transistors of PNP configuration may be utilized, appropriate changes being made, of course, in the polarities of the biasing source or sources. Finally, it will be understood that the embodiment of the invention shown and described is but illustrative and that various modifications may be made therein without departing from the scope and spirit of this invention.

What is claimed is:

1. In combination, a transistor having a current multiplication factor of substantially unity and having also a base, an emitter and a collector, a load circuit connected between said base and collector, and a control circuit connected between said base and emitter and including, in series, a PN diode and a resistor, and means biasing said diode in the current range where the voltage across said diode is substantially independent of the current flowing therethrough.

2. The combination in accordance with claim 1 wherein said transistor is of the junction type.

3. In combination, a transistor having a current multiplication factor of substantially unity and having also an emitter, a base and a collector, a load circuit connected between said base and collector, a control circuit including a PN diode connected between said emitter and base, means biasing said collector in the saturation range, and means biasing said diode in the current range where the voltage across said diode is substantially independent of the current flowing therethrough.

4. In combination, a transistor of the junction type and having a base, an emitter and a collector, a PN diode and a resistance connected in series between said emitter and base, said resistance being large in comparison to the emitter to base resistance, means connected between said emitter and collector and across said diode biasing said diode in the current range where the voltage across said diode is substantially independent of the current flowing therethrough, and a load circuit connected between said collector and base and including an auxiliary biasing source.

References Cited in the file of this patent

UNITED STATES PATENTS 2,579,336 Rack ---------------- Dec. 18, 1951

FOREIGN PATENTS 929,898 France ---------------- July 22, 1947